US005749048A

United States Patent [19]

Masuda

[11] Patent Number: 5,749,048
[45] Date of Patent: May 5, 1998

[54] RECEIVER

[75] Inventor: Hiroshi Masuda, Tokyo, Japan

[73] Assignee: Sony Corporation, Tokyo, Japan

[21] Appl. No.: 886,665

[22] Filed: Jul. 2, 1997

Related U.S. Application Data

[63] Continuation of Ser. No. 681,366, Jul. 23, 1996.

[30] Foreign Application Priority Data

Aug. 8, 1995 [JP] Japan ................... 7-222618

[51] Int. Cl.$^6$ .................................. H04B 1/18
[52] U.S. Cl. ........................ 455/186.1; 455/161.2
[58] Field of Search .................. 455/161.1, 161.2, 455/185.1, 186.1

[56] References Cited

U.S. PATENT DOCUMENTS

| | | | |
|---|---|---|---|
| 5,060,295 | 10/1991 | Borras et al. | 455/186.1 |
| 5,152,011 | 9/1992 | Schwob | 455/186.1 |
| 5,212,818 | 5/1993 | Fukami | 455/186.1 |
| 5,428,825 | 6/1995 | Tomohiro et al. | 455/186.1 |
| 5,530,924 | 6/1996 | Miller | 455/186.1 |

*Primary Examiner*—Reinhard J. Eisenzopf
*Assistant Examiner*—Sam Bhattacharya
*Attorney, Agent, or Firm*—Jay H. Maioli

[57] ABSTRACT

A receiver for receiving a broadcast in which data indicating a broadcast station name has been multiplexed to a main signal includes: a receiving circuit constructed in a frequency synthesizer mode; a memory in which a group of frequency data for selecting the broadcast in the receiving circuit, and data on the broadcast station name is registered; a circuit for taking out the data from a signal received by the receiving circuit; a scanner for allowing the receiving circuit to scan the broadcasting zone for the broadcast; and a detector for detecting the received broadcast at the time of the scanning, when the detector has detected the received broadcast during the scanning, the group of the frequency data which has been registered before the start of the scanning, and the data on the broadcast station name is shifted to the data area in the memory, and one group of the frequency data indicating the frequency thus detected, and the data on the broadcast station name for the received broadcast is registered in the data area in the memory which has become empty by the shift.

2 Claims, 5 Drawing Sheets

FIG. 4

DATA TABLE DTBL

| | DATA ON STATION NAME (PS DATA) | DIVIDING RATIO N | RECEPTION LEVEL S35 | PI CODE |
|---|---|---|---|---|
| P1 P2 P3 . . . P30 | | | | |

FIG. 5

A — AT THE START

| | |
|---|---|
| P1 | RDS-X1 |
| P2 | RDS-X2 |
| P3 | RDS-X3 |
| P4 | RDS-X4 |
| P5 | NOR-X1 |
| P6 | NOR-X2 |
| P7 | NOR-X3 |
| P8 | NOR-X4 |

B — RECEPTION BY RDS STATION

| | |
|---|---|
| P1 | (BLANK) |
| P2 | RDS-X1 |
| P3 | RDS-X2 |
| P4 | RDS-X3 |
| P5 | RDS-X4 |
| P6 | NOR-X1 |
| P7 | NOR-X2 |
| P8 | NOR-X3 |

C

| | |
|---|---|
| P1 | RDS-1 |
| P2 | RDS-X1 |
| P3 | RDS-X2 |
| P4 | RDS-X3 |
| P5 | RDS-X4 |
| P6 | NOR-X1 |
| P7 | NOR-X2 |
| P8 | NOR-X3 |

D — RECEPTION BY RDS STATION

| | |
|---|---|
| P1 | RDS-1 |
| P2 | (BLANK) |
| P3 | RDS-X1 |
| P4 | RDS-X2 |
| P5 | RDS-X3 |
| P6 | RDS-X4 |
| P7 | NOR-X1 |
| P8 | NOR-X2 |

E

| | |
|---|---|
| P1 | RDS-1 |
| P2 | RDS-2 |
| P3 | RDS-X1 |
| P4 | RDS-X2 |
| P5 | RDS-X3 |
| P6 | RDS-X4 |
| P7 | NOR-X1 |
| P8 | NOR-X2 |

F — RECEPTION BY GENERAL STATION

| | |
|---|---|
| P1 | RDS-1 |
| P2 | RDS-2 |
| P3 | (BLANK) |
| P4 | RDS-X1 |
| P5 | RDS-X2 |
| P6 | RDS-X3 |
| P7 | RDS-X4 |
| P8 | NOR-X1 |

G

| | |
|---|---|
| P1 | RDS-1 |
| P2 | RDS-2 |
| P3 | NOR-1 |
| P4 | RDS-X1 |
| P5 | RDS-X2 |
| P6 | RDS-X3 |
| P7 | RDS-X4 |
| P8 | NOR-X1 |

H — RECEPTION BY RDS STATION

| | |
|---|---|
| P1 | RDS-1 |
| P2 | RDS-2 |
| P3 | (BLANK) |
| P4 | NOR-1 |
| P5 | RDS-X1 |
| P6 | RDS-X2 |
| P7 | RDS X3 |
| P8 | RDS-X4 |

I

| | |
|---|---|
| P1 | RDS-1 |
| P2 | RDS-2 |
| P3 | RDS-3 |
| P4 | NOR-1 |
| P5 | RDS-X1 |
| P6 | RDS-X2 |
| P7 | RDS-X3 |
| P8 | RDS-X4 |

J — RECEPTION BY GENERAL STATION

| | |
|---|---|
| P1 | RDS-1 |
| P2 | RDS-2 |
| P3 | RDS-3 |
| P4 | NOR-1 |
| P5 | NOR-2 |
| P6 | RDS-X1 |
| P7 | RDS-X2 |
| P8 | RDS-X3 |

K — RECEPTION BY RDS STATION

| | |
|---|---|
| P1 | RDS-1 |
| P2 | RDS-2 |
| P3 | RDS-3 |
| P4 | RDS-4 |
| P5 | NOR-1 |
| P6 | NOR-2 |
| P7 | NOR-3 |
| P8 | RDS-X1 |

L — END

| | |
|---|---|
| P1 | RDS-1 |
| P2 | RDS-2 |
| P3 | RDS-3 |
| P4 | RDS-4 |
| P5 | NOR-1 |
| P6 | NOR-2 |
| P7 | NOR-3 |
| P8 | (BLANK) |

RECEIVER

This is a continuation of application Ser. No. 08/681,366 filed Jul. 23, 1996.

BACKGROUND OF THE INVENTION

1. Field of the Invention

The present invention relates to a receiver which uses data of, for example, a radio data system (RDS).

2. Description of the Related Art

Among FM broadcast stations in Europe, there are some broadcast stations which render RDS service. This RDS service is to broadcast data called RDS data in addition to the original audio signal. The RDS data is a gathering of digital data concerning broadcast stations, programs and the like, and the RDS data includes:

PI code . . . Broadcast station identification code
PTY code . . . Identification code indicating the content of the programs
PS data . . . Character data indicating names of the broadcast stations, and
AF list . . . List of substitute frequencies.

The PI code is 16 bits of data having a country name code, program code and the like, and is transmitted at a rate of 11 times/second. Also, the PTY code is a code indicating the content or kind of programs such as news, pop music, education, sports, and information in five bits. Further, the AF list is a list of frequencies of a broadcast station which is broadcasting the same program as a program currently under reception, and has data equal to a maximum of 25 stations.

This RDS data is subjected to an encoding process for error correction, and a subcarrier signal having a frequency of 57 kHz (this is three times as much as the frequency of a stereo pilot signal of 19 kHz) is balance modulated by means of the RDS data subjected to the encoding process. The signal thus modulated is added to a monaural signal, which is a main signal, or a stereo composite signal to multiplex the frequency, and this multiplexed signal FM-modulates the main carrier for transmission.

Therefore, even in a case where during moving by, for example, an automobile, the reception state of a broadcast station under reception becomes increasingly worse as the automobile moves, by the utilization of this RDS data, it is possible to easily or automatically select another broadcast station having the same program in a better reception state. Also, it is possible to select, for example, a sports program alone.

In this respect, in the following description, a broadcast station, which is rendering the RDS service, is called an "RDS station", and a broadcast station, which is not rendering the RDS service, is called a "general station".

By the way, there is a receiver constructed in a frequency synthesizer mode, having an autopreset function, which scans at a predetermined frequency interval to search a broadcast wave broadcast from a broadcast station, and to successively register, in the preset memory, data on the frequency of the broadcast wave automatically tuned by means of this search. Among these receivers having the autopreset function, there are some which are capable of reading desired data from among the data registered in the preset memory by the operation of a read key to easily listen to the desired broadcast. The present applicant has proposed an improved preset function which allows the autopreset function to further rearrange the preset data in an FM receiver capable of receiving signals from the RDS station.

On carrying out this improved preset function, (1) the first scan is performed for the received frequency from the lowest frequency to the highest frequency of an FM broadcast zone. During this first scanning, if an RDS station can be received, the RDS station at this time is registered in the preset memory. If, however, a plurality of RDS stations are registered at this registration, the names of the respective broadcast stations are rearranged in alphabetical order by the use of the PS data for registration. (In other words, when data concerning, for example, station names "SWF3" and "HR-1" are registered, rearrangement is performed so that "HR-1" comes ahead of "SWF3" for registration.)

(2) when the preset memory has some memory space left, the second scan is performed. At this second scanning, a general station is registered in the surplus portion in this preset memory. At this time, if a plurality of general stations are registered, the registration is performed in order of frequency (that is, in ascending order of frequency numeral).

In an FM receiver having the improved preset function in paragraphs (1) and (2) described above, the channel selection operation becomes very easy because a channel can be selected by the broadcast station name.

When, however, autopreset is performed by using such a method as described in paragraphs (1) and (2), the content of the preset memory is first cleared at the beginning, and thereafter the frequency data in paragraphs (1) and (2) is registered in the preset memory. If radio frequency noise, or the like occurs at this time, and the broadcast station is not preset, the preset memory will become empty.

In addition, when autopreset is performed by using such a method as described in paragraphs (1) and (2), it is distinguished at the scanning of paragraph (1) whether or not the FM station can be received for each frequency, and when the FM station can be received, it must be judged whether or not the FM station is an RDS station. Also, it is distinguished at the scanning of paragraph (2) whether or not the FM station can be received for each frequency, and when the FM station can be received, it must be confirmed that the FM station is not an RDS station.

As a result, the processing time until the autopreset is finished takes long. When the autopreset is actually performed by using the method of paragraphs (1) and (2) in Europe, there are some cases where it takes five minutes or more to perform the autopreset.

When the processing time is thus long, some users mistake it as a trouble with the receiver, and cancel the autopreset on the way, thus resulting in the empty preset memory.

The present invention solves the above-described problems.

SUMMARY OF THE INVENTION

For this reason, the present invention comprises: in a receiver for receiving a broadcast in which data indicating a broadcast station name has been multiplexed to a main signal, a receiving circuit constructed in a frequency synthesizer mode; a memory in which a group of frequency data for selecting the broadcast in the receiving circuit, and data on the broadcast station name is registered; a circuit for taking out the data from a signal received by the receiving circuit; means for allowing the receiving circuit to scan the broadcasting zone for the broadcast; and detection means for detecting the received broadcast at the scanning, and when the detection means has detected the received broadcast during the scanning, the group of the frequency data which has been registered before the start of the scanning, and the data on the broadcast station name is shifted to the data area in the memory, and one group of the frequency data indicating the frequency thus detected, and the data on the broadcast station name for the broadcast received is registered in the data area in the memory which has become empty by the shift.

Accordingly, every time a broadcast to be registered is received, the old data is detected, and the new data is registered.

BRIEF DESCRIPTION OF THE DRAWINGS

FIG. 4 is a diagram for explaining the data table.

FIG. 5 is a diagram for explaining the present invention.

DETAILED DESCRIPTION OF THE PREFERRED EMBODIMENTS

Figure 1:
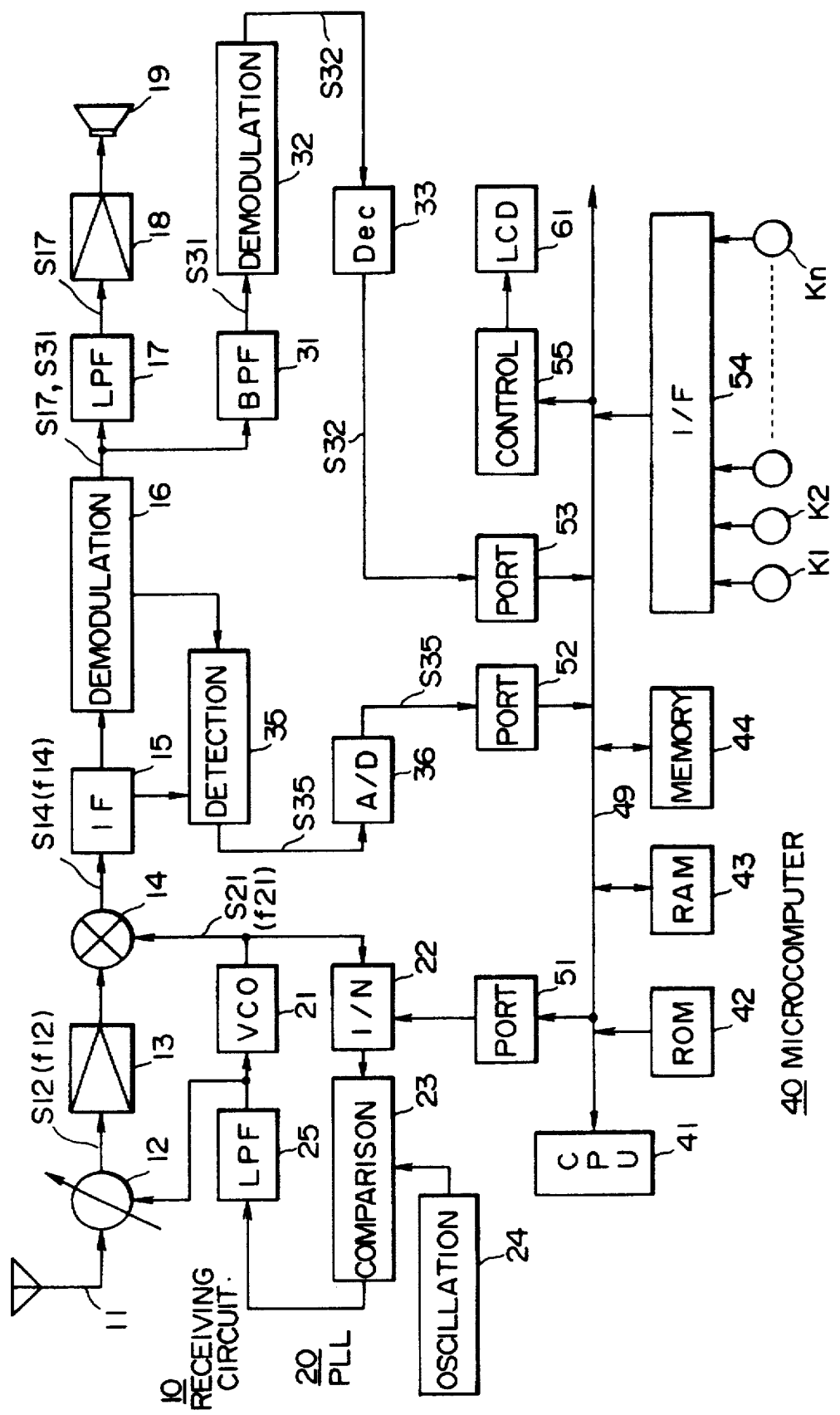
FIG. 1 is a system diagram showing an embodiment according to the present invention.

In FIG. 1, numeral 10 designates a receiving circuit for an FM broadcast. The receiving circuit 10 is constructed in a frequency synthesizer mode, and a received signal through an antenna 11 is supplied to an antenna tuning circuit 12 of an electronic tuning mode to take out a desired FM broadcast wave signal S12 of a frequency f12.

Thus, this signal S12 is supplied to a mixer circuit 14 through a high frequency amplifier 13, and a frequency f21, for example, an oscillation signal S21 of equation (1) is taken out from VCO21. This signal S21 is supplied to the mixer circuit 14 as a local oscillation signal, and is frequency-converted to an intermediate frequency signal S14 (intermediate frequency f14).

$$f21 = f12 + f14 \quad (1)$$

where f14 is an intermediate frequency, for example f14= 10.7 MHz

Then, this intermediate frequency signal S14 is supplied to an FM demodulating circuit 16 through an intermediate frequency circuit 15 having an intermediate frequency block filter and a wide band amplifier to take out an audio signal (monaural signal or stereo composite signal) S17, and a modulated signal S31 modulated by the RDS data. The signal S17 is supplied to a speaker 19 through a low-pass filter 17 and an amplifier 18.

At this time, VCO21 constitutes PLL 20 together with circuits 22 to 25. In other words, a signal S21 from VCO21 is supplied to a variable dividing circuit 22 to be divided into a frequency of 1/N, and these divided signals are supplied to a phase comparator 23. Also, from the oscillation circuit 24, a reference frequency, for example, an oscillation signal having a frequency of 50 kHz is taken out, and this oscillation signal is supplied to the comparator 23. Thus, the comparison output from the comparator 23 is supplied to VCO21 through a low-pass filter 25 as the control voltage. Also, the output voltage from the filter 25 is supplied to the tuning circuit 12 as a channel selection voltage.

Accordingly, in a steady state, a divided signal from the dividing circuit 22 is equal to the oscillation signal from the oscillation circuit 24 in frequency, and therefore, the frequency f21 of the frequency signal S21 at this time is.

$$f21 = N \times 50 \text{ (kHz)} \quad (2)$$
$$= N \times 0.05 \text{ (MHz)}$$

From equations (1) and (2), we get $$f12 = f21 - f14 \quad (3)$$
$$= N \times 0.05 - 10.7 \text{ (MHz)}$$

Accordingly, if a dividing ratio N is varied by "1" between 1964 and 2374, the local oscillation frequency f21 varies at intervals of 50 kHz between 98.2 MHz and 118.7 MHz, and therefore, the receiving frequency f12 is set to vary at a frequency step of 50 kHz in a frequency zone between 87.5 MHz and 108.0 MHz, and correspondingly to the dividing ratio N.

Further, a modulated signal S31 from the FM demodulating circuit 16 is supplied to the RDS demodulating circuit 32 through a band pass filter 31 to demodulate the RDS data S32, and this RDS data S32 is supplied to a decoder circuit 33, from which the RDS data S32 subjected to error correction is taken out.

Also, a part of an intermediate frequency signal f14 and a part of the FM demodulating output are supplied to a level detection circuit 35 from the intermediate frequency circuit 15 and the demodulating circuit 16 to take out a signal S35 indicating a reception level (receiving electric field strength) of the received signal S12. This detection signal S35 is supplied to an AD converter 36 to be converted into a digital detection signal S35.

Further, numeral 40 designates a microcomputer for system control. In this respect, this embodiment used PD-78044 manufactured by NEC Corporation as the microcomputer. This microcomputer 40 has a CPU 41, a ROM 42 in which various processing routines are written, a RAM 43 for a work area, and a memory 44 for storing various data, and these memories 42 to 44 are connected to the CPU 41 through the system bus 49.

Figure 2:
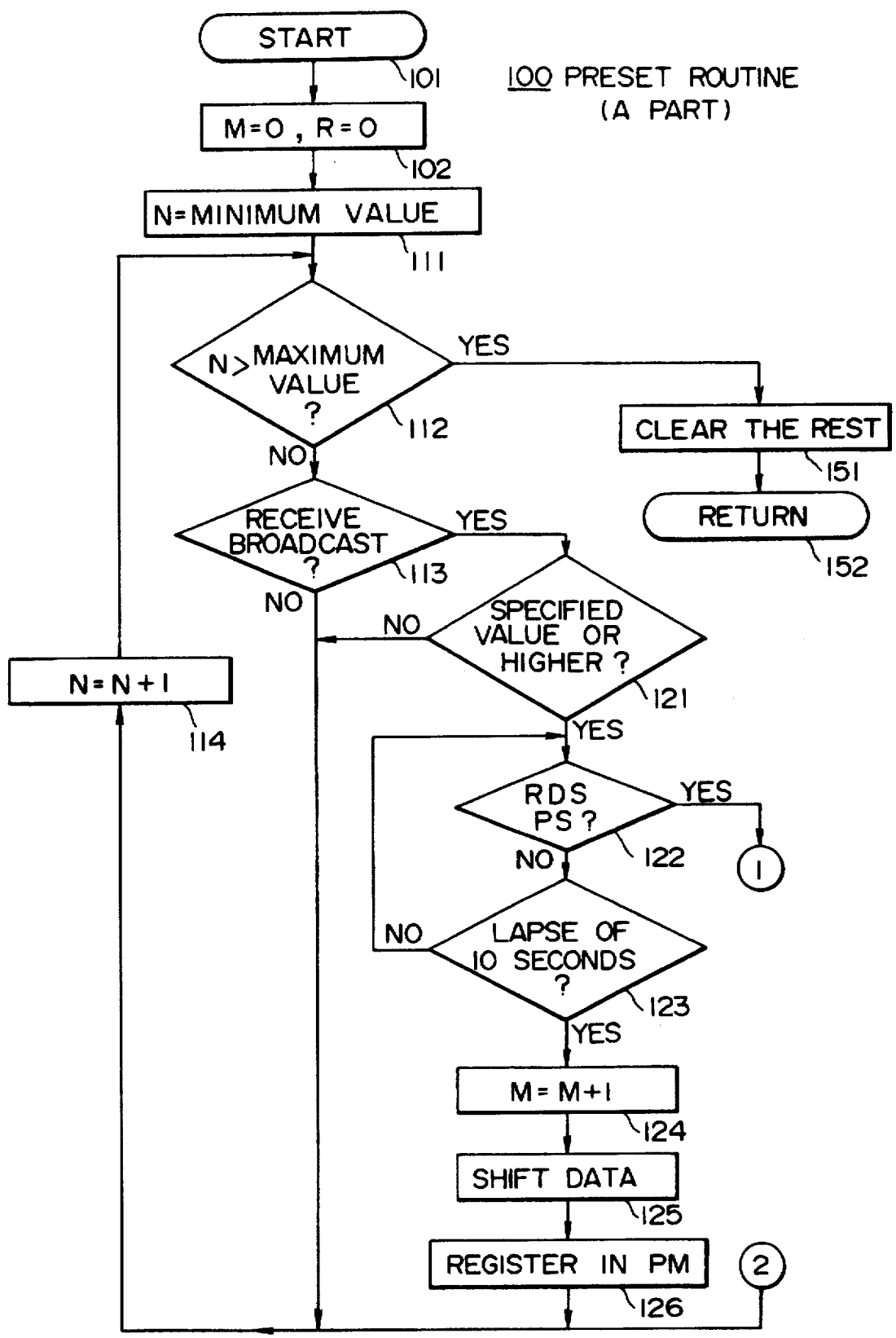
FIG. 2 is a flowchart showing a part of an embodiment according to the present invention.
Figure 3:
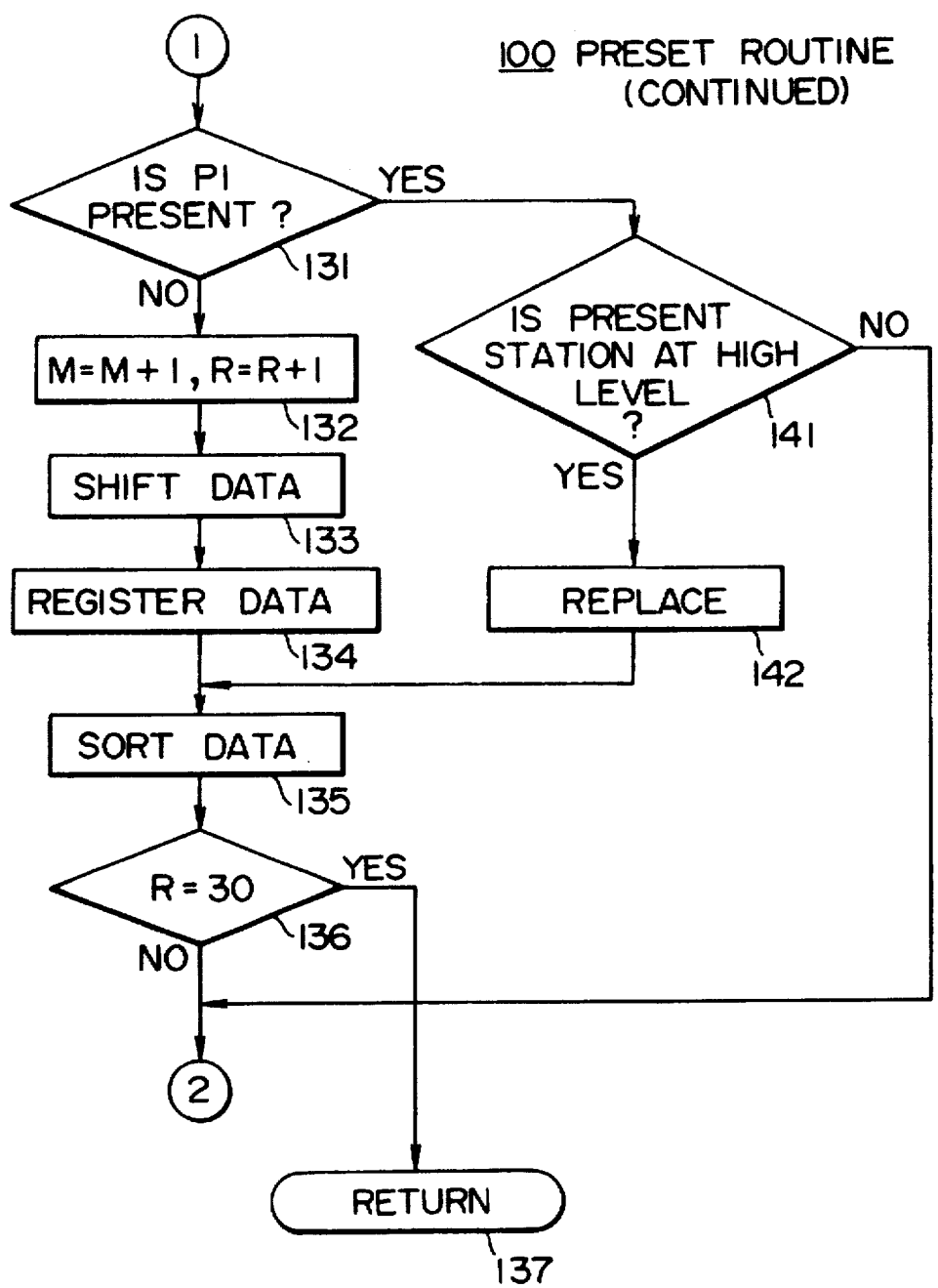
FIG. 3 is a flowchart showing the embodiment continued from FIG. 2.

In this case, a preset routine 100 as shown in, for example, FIGS. 2 and 3 is written in the ROM 42 as a part of the program. Also, for the memory 44, a ROM capable of electrically erasing and writing data is used, or a RAM backed up by a battery (not shown), is used, that is, a nonvolatile memory is used so that any written data can be retained even if the power supply is turned off.

This memory 44 is used as a preset memory, and such a data table DTBL as shown in, for example, FIG. 4 is prepared for the memory 44. This data table DTBL has data areas P1 to P30 for, for example, thirty stations, and design is made such that as PS data (data on a broadcast station name) and frequency data, for example, a dividing ratio N, a reception level indicated by a detection signal S35, PI code and the like are written in each of the data areas. In this respect, in the case of a general station, for example, character codes for digitally displaying a frequency are written as station name data in place of the PS data.

Further, connected to the CPU 41 are, through the system bus 49, an output port 51, input ports 52, and 53 and a key interface circuit 54. The outer port 51 is connected to a dividing circuit 22, and a dividing ratio N is set from the CPU 41 to the variable dividing circuit 22 through the output port 51.

A detection signal S35 at the reception level from an AD converter 36 is inputted into the CPU 41 through the input port 52, and RDS data S32 from a decoder circuit 33 are inputted into the CPU 41 through the input port 53.

Further, various operation keys K1 to Kn such as a channel selection key are connected to the interface circuit 54. In this respect, these operation keys K1 to Kn are all constituted by non-locking type push switches. Also, a display element such as, for example, LCD61 is connected to a bus 49 through a display controller 55.

With such an arrangement, the content of the data table DTBL changes as shown in, for example, FIG. 5 at the time of auto preset, and a RDS station and a general station are preset.

In other words, FIG. 5 simply shows the content of the data table DTBL at the time of autopreset, and explains data areas P1 to P30 for, for example, thirty stations as data areas P1 to P8 for eight stations. Further, FIG. 5 is to show the followings:

RDS-X1 to RDS-X4: Station name of RDS station already registered in the table DTBL before the autopreset is carried out (PS data).

NOR-X1 to NOR-X4: Station name of a general station already registered in the table DTBL before the autopreset is carried out (substituted for frequency).

RDS-1 to RDS-4: Station name of RDS station newly registered in the table DTBL by execution of the autopreset (PS data).

NOR-1 to NOR-3: Station name of a general station newly registered in the table DTBL by execution of the autopreset (substituted for frequency).

Also, in the following description, symbols M and R show counters by software to be described later.

Counter M: A summation of broadcast stations registered in the data table DTBL.

Counter R: A number of RDS stations registered in the data table DTBL.

Before the autopreset is carried out, as shown in FIG. 5A, in the data areas P1 to P4 of the data table DTBL, the station name data of RDS-X1, RDS-X2, RDS-X3 and RDS-X4, in which the station names have been sequentially arranged in alphabetical order, are stored as an RDS station. In the subsequent data areas P5 to P8, the station name data of NOR-X1, NOR-X2, NOR-X3 and NOR-X4, which have been arranged in order of frequency, are stored as a general station.

When the autopreset operation is started from a state in which the content of the data table DTBL is as shown in FIG. 5A, it is assumed that a RDS station can be received at a certain frequency and its station name is RDS-1. Then, as shown in FIG. 5B, among the station name data of the data table DTBL, the data NOR-X4 in data area P8 is cleared, and the data RDS-X1 to NOR-X3 for data areas P1 to P7 are all shifted back by one data area (data area of a higher number). The data area P1 is made blank.

Consecutively, as shown in FIG. 5C, the station name data RDS-1 of an RDS station, which could be received this time, is written in the data area P1 which has been made blank.

Next, it is assumed that a RDS station can be received at a certain frequency and its station name is RDS-2. Then, as shown in FIG. 5D, among the station name data of the data table DTBL, the data NOR-X3 in the data area P8 is cleared, and the data RDS-X1 to NOR-X2 for data areas P2 to P7 are all shifted back by one data area. The data area P2 is made blank.

Consecutively, as shown in FIG. 5E, the station name data RDS-2 of an RDS station, which could be received this time, is written in the data area P2 which has been made blank.

Also, the station name data of RDS station from the data area P1 to the data area, in which the data have been written this time, i.e., data area P2 in this case, are sorted in alphabetical order by the station name. The sorting result is stored in the data area P1 to the data area P2, in which the data have been written this time, of the table DTBL as shown in FIG. 5E.

Further, when the content of the data table DTBL is in a state shown in FIG. 5E, it is assumed that a general station can be received at a certain frequency and its station name (substituted for frequency) is NOR-1. Then, as shown in FIG. 5F, in the data table DTBL, a data area next to the data area in which the station name data of an RDS station has been newly registered finally at that point of time, that is, in this case, NOR-X2 in data area P8 is cleared, and the station name data RDS-X1 to NOR-X1 from the data area P3 next to the data area P2 to the data area P7 are all shifted back by one data area. The data area P3 is made blank.

Then, as shown in FIG. 5G, the station name data NOR-1 of a general station, which could be received this time, is written in the data area P3, which has been made blank.

Next, it is assumed that a RDS station can be received at a certain frequency and its station name is RDS-3. Then, as shown in FIG. 5H, among the station name data on the data table DTBL, a data area next to the data area in which the station name data of RDS station has been newly registered finally at that point of time, that is, in this case, NOR-X1 in data area P8 is cleared, and the data NOR-1 to RDS-X4 from the data area P3 next to the data area P2 to the data area P7 are all shifted back by one data area. The data area P3 is made blank.

Then, as shown in FIG. 5I, the station name data RDS-3 of an RDS station, which could be received this time, is written in the data area P3 which has been made blank.

Also, the station name data of an RDS station from the data area P1 to the data area, in which the data has been written this time, i.e., data area P3 in this case, are sorted in alphabetical order by the station name. The sorting result is stored in the data area P1 to the data area P3, in which the data has been written this time, on the table DTBL as shown in FIG. 5I.

Further, when the content of the data table DTBL is in a state shown in FIG. 5I, it is assumed that a general station can be received at a certain frequency and its station name (substituted for frequency) is NOR-2. Then, as shown in FIG. 5J, in the data table DTBL, a data area next to the data area in which the station name data of a general station has been newly registered finally at that point of time, that is, in this case, RDS-X4 in data area P8 is cleared, and the data RDS-X1 to RDS-X3 in the data area P5 next to the data area P4 to the data area P7 are all shifted back by one data area. The data area P5 is made blank. The station name data NOR-2 for the general station, which could be received this time, is written in the data area P5 which has been made blank.

When a RDS station has been received in this way, the old data for the RDS station and the general station are shifted back by one data area in the data table DTBL, and the station name data of the RDS station, which has been received this time, is registered in the data area which has become blank by the shifting. Also, at this time, every time the RDS station is newly registered, all the station name data of new RDS stations are sorted in alphabetical order.

In this respect, when the station name data are shifted, registered or sorted, all data (dividing ratio N, reception level S35 and PI code), which form a group with the station name data in the data table DTBL, are stored together with the station name data. Also, as described later, the PI code is actually checked, and the RDS station with a higher reception level is registered among the RDS stations having equal PI code.

On the other hand, when a general station has been received, old station name data of a general station in the data table DTBL are shifted back by one data area, and the station name data (substituted for frequency) of a general station received this time is registered in the data area which has become blank by the shifting. In this respect, the station name data of a general station are to be registered in order of frequency at the result because they are registered in order of scanning at this time.

Accordingly, when the scan has been terminated, the RDS stations are registered in order of the station name in a data area having a lower data area number in the data table DTBL as shown in, for example, FIG. 5K, and in the subsequent data area, general stations are to be registered in order of frequency.

In this respect, when the scan has been terminated, when an old station name data remains as shown in, for example, FIG. 5K, the station name data is erased, and as shown in FIG. 5L, the RDS station received by this scan and general stations alone are left in the data table DTBL.

The above-described registration process is realized when the CPU 41 executes a preset routine 100.

When the execution of autopreset is directed by using a method of turning on the power supply while pressing, for example, a predetermined key among keys K1 to Kn, processing of the CPU 41 starts with a step 101 of a routine 100, and next, counters M and R are initialized to zeros in step 102.

Subsequently, in step 111, the dividing ratio N of a variable dividing circuit 22 is set to 1964, a minimum value, and a receiving circuit 10 is caused to be in a received state at the lowest frequency of 87.5 MHz. Next, in step 112, it is checked whether or not the dividing ratio N of the variable dividing circuit 22 has exceeded the maximum value of 2374, and in this case, since the maximum value has not been exceeded, the sequence will proceed from Step 112 to Step 113.

In this Step 113, a detection signal S35 supplied to the port 52 is checked to thereby distinguish whether or not a broadcast wave signal S12 is received. If is has not been received, the sequence will proceed from Step 113 to Step 114, and in this Step 114, the dividing ratio N of the variable dividing circuit 22 is incremented by "1", and thereafter the sequence will return to Step 112.

Accordingly, Steps 112 to 114 are repeated thereafter, and this repetition increases the received frequency f12 of the receiving circuit 10 in order every 50 kHz from the lowest frequency, that is, scanning is to be started with the lowest frequency.

On receipt of a broadcast wave signal S12 at a certain frequency, this signal is discriminated by Step 113, and the sequence proceeds from Step 113 to Step 121. In this Step 121, a detection signal S35 is checked to thereby check whether or not the reception level of the broadcast wave signal S12 currently under reception exceeds a specified value, for example, 35 dBμ. If the reception level does not reach the specified value, the sequence proceeds from Step 121 to Step 114 to continue the scanning.

If, however, the reception level exceeds the specified value in Step 121, the sequence proceeds from Step 121 to Step 122. In this Step 122, data S32 to be supplied to a port 53 are checked to thereby check whether or not the broadcast station under reception is a RDS station and PS data (station name data) can be obtained. By means of Step 123, the check on Step 122 is carried out for, for example, ten seconds.

In the routine 100, when the PS data cannot be obtained even at the RDS station, design is made such that preset is performed as a general station. Therefore, in such an occasion, and when it is not the RDS station, that is, the general station, the sequence proceeds from Step 123 to Step 124. In the Step 124, a counter M indicating the total number of broadcast stations is incremented by "1".

Next, in Step 125, in the same manner as in, for example, FIG. 5F, data from the M-th data area PM to the 29th data area P29 on the data table DTBL are shifted from the (M+1)th data area P(M+1) to the 30th data area P30, and at the same time, the M-th data area PM is cleared. In other words, when a general station has been received, the old data in the general station on the data table DTBL are shifted back by one data area, and the lead data area before the shifting is made blank.

Next, in Step 126, a character code indicating, for example, a frequency f12 of the general station (including RDS stations having no PS data) received this time is registered as data of broadcast station name in the M-th data area PM which has been cleared in Step 125, and the dividing ratio N, which has been set to the variable dividing circuit 22, is registered as the frequency data. Thereafter, the sequence returns to Step 114.

Thus, when a general station is received at or above the specified reception level during scanning, the old data on the data table DTBL are shifted, and the station name (substituted for frequency) of the general station, and the dividing ratio N as data indicating the received frequency f12 are registered in the data area which is a data area on the data table DTBL, and was the lead data area among data areas on which old data were registered.

On the other hand, in Steps 122 and 123, when a broadcast station currently under reception has been judged to be a RDS station having PS data, the sequence proceeds from Step 122 to Step 131.

In Step 131, it is checked whether or not there is any data of a RDS station having a PI code equal to the PDS station currently under reception on the data table DTBL. If not, the sequence proceeds from Step 131 to Step 132, and in the Step 132, the counters M and R are incremented by "1" respectively.

Subsequently, the sequence proceeds to Step 133, wherein the same manner as in, for example, FIG. 5B, data from the R-th data area PR to the 29th data area P29 among the data on the data table DTBL are shifted from the (R+1)th data area P(R+1) to the 30th data area P30, and at the same time, the R-th data area PR is cleared.

In other words, when a RDS station has been received, data after the data area next to the data area, in which the RDS station has finally been newly registered, on the data table DTBL are shifted back by one data area, and the lead data area before the shifting is made blank.

Next, in Step 134, in the same manner as in, for example, FIG. 5C, data (PS data, dividing ratio N, reception level S35 and PI code) of a RDS station currently under reception are registered in the R-th data area PR which has been cleared in Step 133 on the data table DTBL.

Further, in Step 135, the data on the RDS stations on the data table DTBL are sorted in units of data for one station in alphabetical order of station names in accordance with the PS data. Next, in Step 136, it is checked whether or not R=30, that is, whether or not the data on the RDS stations have been registered in all data areas P1 to P30 on the data table DTBL. If R is not equal to 30 (not registered in all data areas), the sequence returns from Step 136 to Step 114.

Accordingly, in Steps 131 to 136, new RDS stations are registered in order of station name. Thereafter, the processes after Step 112 are repeated.

When a RDS station already registered on the data table DTBL and a RDS station having equal PI code have been received during scanning, a RDS station having a higher reception level is registered on the data table DTBL.

In other words, when there have been data on a RDS station received this time and on a RDS station having equal PI code on the data table DTBL in Step 131, the sequence proceeds from Step 131 to Step 141. In Step 141, the reception level of the RDS station received this time, and that of the RDS station registered on the data table DTBL (having equal PI code) are compared by means of a signal S35, and it is distinguished whether or not the reception level of the RDS station received this time is higher than that of the RDS station registered on the data table DTBL.

When the reception level of the RDS station received this time is lower than that of the RDS station registered on the data table DTBL, the sequence returns from Step 141 to Step 114, and the RDS station received this time is ignored to continue the scanning.

When the reception level of the RDS station received this time is higher than that of the RDS station registered on the data table DTBL, the sequence proceeds from Step 141 to Step 142. In Step 142, the data (PS data, dividing ratio N, reception level and PI code) of the RDS station received this time are overwritten on the data in the data area among data areas on the data table DTBL, in which the data having equal PI code are registered. Thereafter, the sequence proceeds to Step 135.

Accordingly, when two or more RDS stations having equal PI code have been received during scanning, the data of a RDS station having the maximum reception level among them are to be registered on the data table DTBL.

When the data of the RDS stations are registered in all the data areas P1 to P30 on the data table DTBL, R becomes equal to 30. Therefore, the sequence proceeds from Step 136 to Step 137, and the Step 137 terminates the routine 100.

When the scan reaches the highest frequency and the dividing ratio N of the variable dividing circuit 22 exceeds the maximum value of 2374 even if R is not equal to 30, this is detected in Step 112, and the sequence proceeds from Step 112 to Step 151. In Step 151, the 30th data area P30 from the (M+1)-th data area P(M+1) is cleared, and thereafter, Step 152 terminates the routine 100.

According to the routine 100, when one new data is registered at the time of preset, one old data is to be erased. Therefore, even when radio frequency noise occurs in the course of preset and a broadcast station has not been preset, the old data can be left on the data table DTBL. Also, even if the user cancels the autopreset in the course, the old data can be still left.

Further, it is possible to register both a RDS station and a general station on the data table DTBL by one scanning. Therefore, the time required for autopresetting a RDS station and a general station can be reduced to about one half of that before, thus improving the degree of ease of use. Yet, in this case, the RDS stations are registered in order of station name, and if the data table DTBL has space available, the general stations can be registered in order of frequency subsequently to the RDS stations.

In this respect, the RDS station and the general station which have been preset on the data table DTBL can be selected in the same manner as conventional receivers. In other words, by operating, for example, keys K1 to Kn, the data area, in which the data of a desired broadcast station on the data table DTBL have been registered, is designated. Then, the dividing ratio N is taken out from the designated data area, and the dividing ratio N thus taken out is set to the variable dividing circuit 22 through the port 51 to select the desired broadcast station.

At this time, the data on the station name is taken out from the designated data area, and is supplied to a display controller 55 to display the station name on LCD61. In this respect, in the case of a general station, for example, the frequency is digitally displayed as the station name.

In the above description, on registering a RDS station on the data table DTBL, the data was shifted, registered and sorted. However, it is retrieved from the data area P1 by linear search, for example, on which data area among the data areas P1 to P30 the data on the station name of the RDS station to be registered should be registered. If the data area to be registered is found, all the data on data areas after the data area are successively shifted to data area behind by one data area respectively, and the data in a new RDS station can be also registered in a data area found thereafter.

Further, the station name of a general station can be inputted by the user to register it on the data table DTBL.

According to the present invention, even when radio frequency noise or the like occurs in the course of preset and a broadcast station has not been preset, the old data can be left on the data table. Also, even if the user cancels the autopreset in the course, the old data can be still left.

What is claimed is:

1. A receiver for receiving a broadcast signal in which data indicating a broadcast station name associated with the broadcast signal has been multiplexed, comprising:

a receiving circuit for receiving the broadcast signal and operating in a frequency synthesizer mode;

a memory for registering a group of frequency data and associated broadcast station name data arranged in an alphabetical ranking according to said broadcast station name for selecting said broadcast signal in said receiving circuit;

a circuit for demultiplexing said associated broadcast station name data from the broadcast signal received by said receiving circuit and storing a frequency of said signal and said associated broadcast station name data in said memory;

rank determining means for determining an alphabetical rank of said associated broadcast station name of said received broadcast signal;

means for causing said receiving circuit to scan a broadcasting zone for said broadcast signal; and detection means for detecting said received broadcast signal at the time of said scanning, wherein when said detection means has detected said received broadcast signal during said scanning, a segment of said group of frequency data and associated broadcast station name data which has been registered before the start of said scanning including only broadcast station names with alphabetical ranks that are lower than the rank of said received broadcast signal detected by said rank detecting means are shifted to a second data area from a first data area in said memory, and said demultiplexing and storage circuit stores said frequency of said received broadcast signal thus detected and said data indicating said broadcast station name in said first data area in said memory following the shift.

2. The receiver as defined in claim 1, wherein said receiver operates in a broadcast zone in which the broadcast signal having the data indicating said associated broadcast station name multiplexed to a main signal and a general broadcast signal for broadcasting only a main signal mixedly exist, said group of frequency data including frequencies corresponding to a plurality of other general broadcast signals ranked in order of frequency and arranged in said memory following said broadcast signals having associated broadcast station name data, further comprising:

second detection means for detecting said general broadcast signal at the time of said scanning, and when said second detection means has detected said general broadcast signal during said scanning from among said group of frequency data which has been registered before the start of said scanning, and said data indicating said broadcast station name, a segment of said group of frequency data containing frequency data corresponding to general broadcast signals and each with a frequency greater than the frequency of said detected general broadcast signal is shifted to said second data area in said memory, and said frequency data indicating said frequency of said general broadcast signal thus detected is registered in said first data area in said memory following the shift.

* * * * *